United States Patent
Chen et al.

(10) Patent No.: US 8,691,688 B2
(45) Date of Patent: Apr. 8, 2014

(54) METHOD OF MANUFACTURING SEMICONDUCTOR STRUCTURE

(75) Inventors: Hsin-Yu Chen, Nantou County (TW); Yu-Han Tsai, Kaohsiung (TW); Chun-Ling Lin, Tainan (TW); Ching-Li Yang, Pingtung County (TW); Home-Been Cheng, Keelung (TW)

(73) Assignee: United Microelectronics Corp., Hsinchu (TW)

( * ) Notice: Subject to any disclaimer, the term of this patent is extended or adjusted under 35 U.S.C. 154(b) by 5 days.

(21) Appl. No.: 13/525,568

(22) Filed: Jun. 18, 2012

(65) Prior Publication Data

US 2013/0337645 A1 Dec. 19, 2013

(51) Int. Cl.
*H01L 21/44* (2006.01)

(52) U.S. Cl.
USPC ........... 438/653; 438/607; 438/642; 438/687; 438/688; 257/741; 257/751; 257/761; 257/762

(58) Field of Classification Search
None
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,387,805 B2 | 5/2002 | Ding |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,506,668 B1 * | 1/2003 | Woo et al. .................... 438/584 |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |

(Continued)

*Primary Examiner* — Kyoung Lee
(74) *Attorney, Agent, or Firm* — WPAT, PC; Justin King (57) ABSTRACT

A method of processing a substrate is provided. The method includes: providing a substrate, wherein the substrate includes a silicon layer; etching the substrate to form a cavity; filling a first conductor in part of the cavity; performing a first thermal treatment on the first conductor; filling a second conductor in the cavity to fill-up the cavity; and performing a second thermal treatment on the first conductor and the second conductor.

17 Claims, 5 Drawing Sheets

(56) References Cited

U.S. PATENT DOCUMENTS

| | | |
|---|---|---|
| 6,633,083 B2 | 10/2003 | Woo |
| 6,660,633 B1 * | 12/2003 | Lopatin et al. ............ 438/687 |
| 6,746,936 B1 | 6/2004 | Lee |
| 6,770,977 B2 * | 8/2004 | Kishida et al. ............ 257/761 |
| 6,778,275 B2 | 8/2004 | Bowes |
| 6,800,930 B2 | 10/2004 | Jackson |
| 6,812,193 B2 | 11/2004 | Brigham et al. |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |

* cited by examiner

METHOD OF MANUFACTURING SEMICONDUCTOR STRUCTURE

BACKGROUND OF THE INVENTION

1. Field of the Invention

The disclosure relates in general to a method of manufacturing a semiconductor structure, and more particularly to the method of manufacturing the semiconductor structure including a two-step process of filling conductors and performing thermal treatments.

2. Description of the Related Art

TSV (through silicon via) technology is developed for providing interconnection between stacked wafers (chips) in three-dimensional integrated circuit (3D-IC) design. Compared to the conventional stacked IC package, TSV creates a 3D vertical conducting path, and the length of conductive line is reduced to equal the thickness of wafers (chips) substantially, thereby increasing the density of stacked wafers (chips) and enhancing the speed of signal transfer and electrical transmission. Also, parasitic effect can be decreased due to the vertical connection of conductor, so as to lower power consumption. Moreover, TSV technology offers the heterogeneous integration of different ICs (for example; stacking memory on the processor) to achieve the multi-functional integration.

There are various processes using TSV technology for the three-dimensional integration. Those processes can be classified as via-first approach, via-middle approach, and via-last approach according to the forming process in order and final configurations. Whether the process (ex: via-first approach, via-middle approach, or via-last approach) is adopted, the quality of through silicon via filled with conductor has considerable effect on the electrical performance of the stacked wafers (chips).

SUMMARY OF THE INVENTION

The disclosure is directed to a method of manufacturing a semiconductor structure. The embodiment of the disclosure utilizes a two-step process, including filling a first conductor in part of a cavity and performing a first thermal treatment on the first conductor, and filling a second conductor in the cavity and performing a second thermal treatment on the second conductor. The two-step process can prevent the conductor layer from volume expansion and penetrating the cavity to diffuse into the substrate and the lines on the substrate, and thus enhances the electrical properties and the reliability of the applied devices.

According to an aspect of the present disclosure, a method of manufacturing a semiconductor structure is disclosed. The method includes: providing a substrate, wherein the substrate includes a silicon layer; etching the substrate to form a cavity; filling a first conductor in part of the cavity; performing a first thermal treatment on the first conductor; filling a second conductor in the cavity to fill-up the cavity; and performing a second thermal treatment on the first conductor and the second conductor.

The disclosure will become apparent from the following detailed description of the preferred but non-limiting embodiments. The following description is made with reference to the accompanying drawings.

DETAILED DESCRIPTION OF THE INVENTION

In the embodiment of the present disclosure, a two-step process of manufacturing a semiconductor structure is utilized. The process includes filling a first conductor in part of a cavity and performing a first thermal treatment on the first conductor, and filling a second conductor in the cavity and performing a second thermal treatment on the second conductor. The two-step process can prevent the conductor layer from volume expansion and penetrating to diffuse into the substrate and the lines on the substrate, and thus enhances the electrical properties and the reliability of the applied devices. The embodiment is described in details with reference to the accompanying drawings. The procedures and details of the formation method and the structure of the embodiment are for exemplification only, not for limiting the scope of protection of the disclosure. Moreover, secondary elements are omitted in the disclosure of the embodiment for highlighting the technical features of the disclosure. The identical elements of the embodiment are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1A:
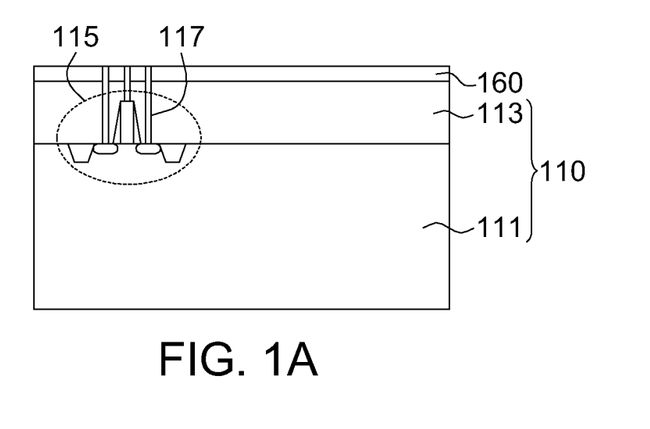
FIG. 1A-FIG. 1F illustrate a method of manufacturing a semiconductor structure according to the embodiment of the disclosure.

FIG. 1A-FIG. 1F illustrate a method of manufacturing a semiconductor structure according to the embodiment of the disclosure. Please refer to FIG. 1A. A substrate 110 is provided, and the substrate 110 includes a silicon layer 111. The substrate 110 can include an inter-layer dielectric (ILD) 113 formed on the silicon layer 111. The inter-layer dielectric 113 can absorb ions, such that active devices 115, such as source electrodes, drain electrodes, or doped layers, under the inter-layer dielectric 113 are not affected by the penetrated ions. In the embodiment, the materials of the inter-layer dielectric 113 can comprise silicon oxide materials, such as phosphosilicate glass (PSG) or borophosphosilicate glass (BPSG). In the embodiment, as shown in FIG. 1A, a plurality of active devices 115 can be formed on the silicon layer 111, a plurality of contact holes 117 can be formed in the inter-layer dielectric 113, and conductive materials can be filled in the contact holes 117 to form a plurality of contact plugs optionally. After the substrate 110 is provided, a nitride layer 160 can be formed on the substrate 110 optionally. In the embodiment, the nitride layer 160 can be formed on the inter-layer dielectric 113. In the following manufacturing process, the nitride layer 160 can be used as a hard mask when the substrate 110 is etched to form a cavity. Further, the nitride layer 160 can also be used as a stop layer when a chemical mechanical polishing (CMP) is performed on the conductors.

Figure 1B:
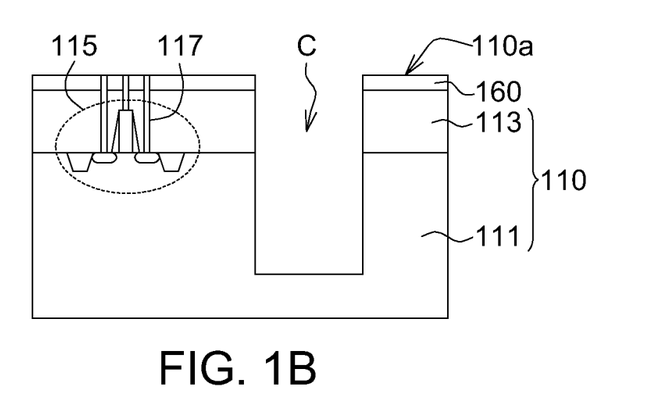

Please refer to FIG. 1B. The substrate 110 is etched to form a cavity C. The cavity C extends down from a surface 110a of the substrate 110. In one embodiment, the depth of the cavity C is in the range of 40-125 µm (micrometer), and the diameter of the cavity C is in the range of 5-25 µm. However, the dimensions of the cavity C are not limited hereto, and could be modified in accordance with the actual needs of the practical applications.

Figure 1C:
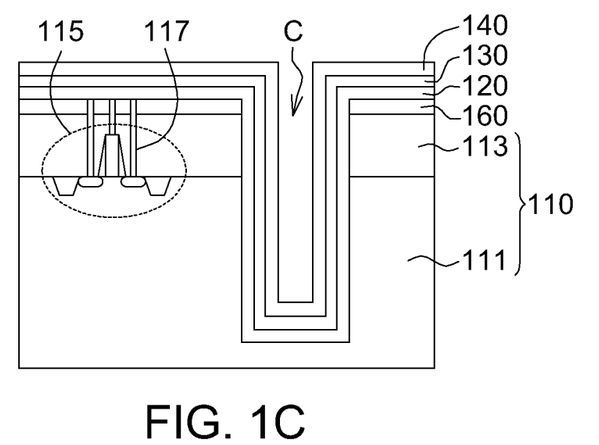

Please refer to FIG. 10. In one embodiment, after the cavity C is formed, a liner film 120 can be formed in the cavity C. In the embodiment, the liner film 120 can be formed on the substrate 110 and in the cavity C. The liner film 120 can act as an isolation layer, for isolating the conductor layer in the cavity C (formed in the subsequent procedure) from the substrate 110 and the active devices 115 in the substrate 110.

Next, as shown in FIG. 10, in one embodiment, a barrier layer 130 can be formed in the cavity C, such as formed on the liner film 120. In the embodiment, the barrier layer 130 can be formed on the substrate 110 and in the cavity C. The barrier layer 130 could be a stack layer of suitable materials. For example, if copper is used as the material for the conductor layer subsequently, a Ta/TaN stack layer could be applied as the barrier layer 130 for preventing copper from diffusing into the liner film 120 and the substrate 110.

Next, as shown in FIG. 10, in one embodiment, a seed layer 140 can be formed on the barrier layer 130. In the embodiment, the seed layer 140 can be formed on the barrier layer 130 and in the cavity C. Materials of the seed layer 140 depend on the material of the conductor layer filled in the cavity C. For example, if copper is used as the material for the conductor layer subsequently, the seed layer 140 includes copper.

Figure 1D:
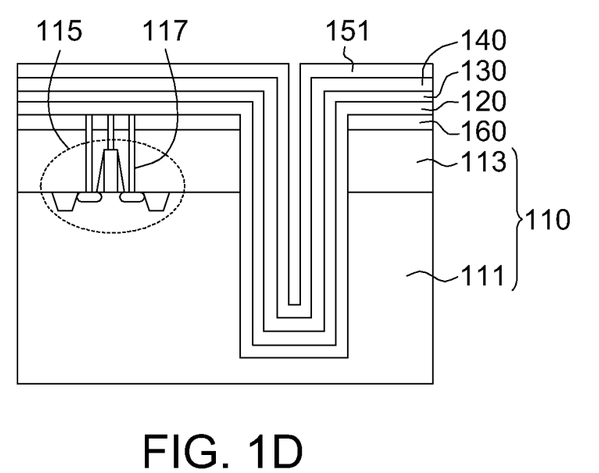

Please refer to FIG. 1D. A first conductor 151 is filled in part of the cavity C. As shown in FIG. 1D, the first conductor 115 is filled in part of the cavity C as a film. The first conductor 115 can also be filled in lower half part of the cavity C without fully covering the side walls of the cavity C. However, the morphology of the first conductor 151 filled in the cavity C is not limited hereto, and could be modified in accordance with the actual needs of the practical applications. In the embodiment, the first conductor 115 is filled in part of the cavity C by an electrochemical plating (ECP) process. In one embodiment, the volume of the first conductor 151 is 20-80% of the volume of the cavity C. The materials of the first conductor 151 comprise, for example, copper, gold, silver, and tin.

Next, a first thermal treatment is performed on the first conductor 151. In one embodiment, the first thermal treatment is performed by heating the first conductor 151 at 350-450° C. In one embodiment, the first thermal treatment is performed by heating the first conductor 151 for 5 to 60 minutes. The heating temperature in the first thermal treatment is basically about equal to or higher than the temperature in the thermal treatment in the fabrication of the back end of the line (BEOL). However, the heating temperature in the first thermal treatment is not limited hereto, and could be modified in accordance with the actual needs of the practical applications.

In one embodiment, applying copper as the material of the first conductor 151 is taken for an example. The thermal expansion coefficient of copper is about 8 times of the thermal expansion coefficient of silicon, and such big difference makes that the volume of copper changes more greatly than the volume of the silicon layer 111 does when heated. In the embodiment, when the first thermal treatment is performed, the first conductor 151 is only filled in part of the cavity C. Therefore, when the first conductor 151 is heated in the first thermal treatment, the expanded volume of the first conductor 151 can extend to the unfilled part of the cavity C. As such, the first conductor 151 does not extend horizontally to penetrate the cavity C and diffuse into the liner film 120 and the substrate 110 to cause a tip crack, which would result in the formation of voids in the conductor layer in the cavity C (formed in the subsequent procedure) and loose contact.

Figure 1E:
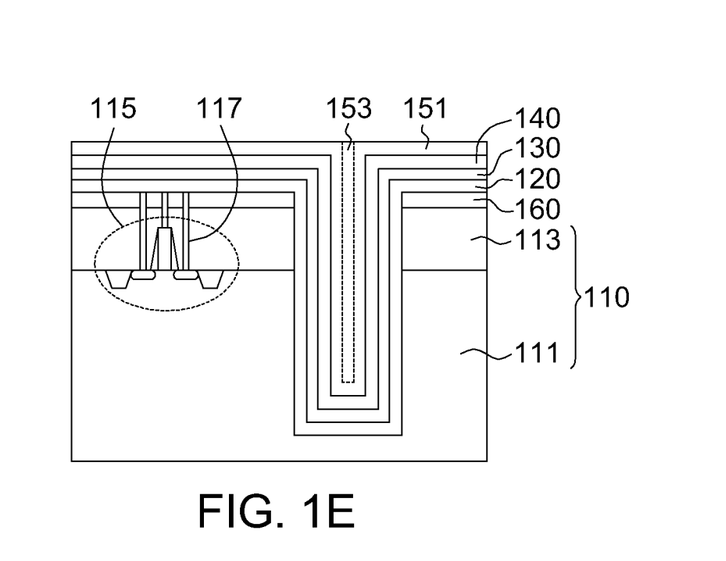

Please refer to FIG. 1E. A second conductor 153 is filled in the cavity C to fill-up the cavity C. A material of the first conductor 151 is the same as that of the second conductor 153. As shown in FIG. 1E, the portion filled with the second conductor 153 is indicated with a dash line defined region. However, the morphology of the second conductor 153 filled in the cavity C is not limited hereto, and could be modified in accordance with the actual needs of the practical applications. Materials of the second conductor 153 depend on the material of the first conductor 151. The materials of the second conductor 153 comprise, for example, copper, gold, silver, and tin.

Next, a second thermal treatment is performed on the first conductor 151 and the second conductor 153. In one embodiment, the second thermal treatment is performed by heating the first conductor 151 and the second conductor 153 at 350-450° C. In one embodiment, the second thermal treatment is performed by heating the first conductor 151 and the second conductor 153 for 5 to 60 minutes. The heating temperature of the second thermal treatment is basically about equal to or higher than the temperature of the thermal treatment in the fabrication of the back end of the line. However, the heating temperature in the second thermal treatment is not limited hereto, and could be modified in accordance with the actual needs of the practical applications.

In one embodiment, applying copper as the material of the first conductor 151 and the material of the second conductor 153 is taken for an example. After the first thermal treatment is performed, the expanded volume of the first conductor 151 after being heated has sufficiently extended to the unfilled part of the cavity C. Therefore, in the second thermal treatment, the volume of the first conductor 151 does not greatly expand again when being heated, and only the second conductor 153 is heated and of which the volume expands. As such, compared to filling-up the cavity C with conductive materials in a single step followed by a single-step thermal treatment, in the embodiment, the stepwise expansion of the volume of the copper in the cavity C in two consecutive thermal treatments can reduce the stress caused by the volume expansion of the copper on the interface between the cavity C and the substrate 110. The two-step process of filling two conductors and performing two thermal treatments can prevent copper from volume expansion and extending horizontally to penetrate the cavity C and diffuse into the liner film 120 and the substrate 110 to cause a tip crack, which would result in the formation of voids in the conductor layer in the cavity C (formed in the subsequent procedure) and loose contact. The two-step process can also prevent copper from extending vertically to penetrate and diffuse into the lines on the substrate 110 to cause a pumping issue, which would result in the deformation of the pattern of the lines. Based on the above-mentioned, the two-step process can further enhance the electrical properties and the reliability of the applied devices. The deformation of the pattern of the lines on the substrate 110 would have undesired effect on the fabrication of the back end of the line, resulting in decreasing the electrical properties and the reliability of the applied devices.

Figure 1F:
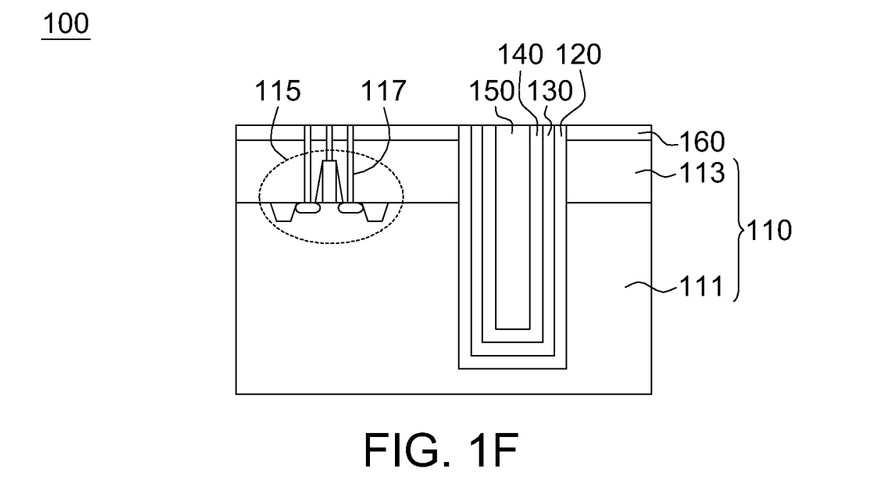

Please refer to FIG. 1F. A chemical mechanical polishing (CMP) is performed on the first conductor 151 and the second conductor 152 to remove part of the first conductor 151 and the second conductor 153 extruded from the cavity C. The first conductor 151 and the second conductor 153 filled in the cavity C forms a conductor layer 150 after being chemical mechanical polished. As shown in FIG. 1F, in the embodiment, part of the liner film 120, the barrier layer 130, and the seed layer on the substrate 110 is removed by the chemical mechanical polishing as well. As such, the semiconductor structure 100 as shown in FIG. 1F is formed.

In one embodiment, applying copper as the material of the conductor layer 150 is taken for an example, which makes the materials of the first conductor 151 and the second conductor 153 are copper. Performing the first thermal treatment on the first conductor 151 filled in part of the cavity C provides sufficient space for the grains of the first conductor 151 to grow in when being heated. After the first thermal treatment is completed, the copper of the first conductor 151 has proceeded self-annealing. Next, the cavity C is filled-up with the second conductor 153 followed by performing the second thermal treatment. At this stage, the second conductor 153 has proceeded self-annealing. As such, utilizing the two-step process, including filling the first conductor 151 in part of the cavity C and performing the first thermal treatment on the first conductor 151, and then filling the second conductor 153 in the cavity C and performing the second thermal treatment on the second conductor 153, can make the self-annealing effect of the copper in the cavity C more completely. As such, self-annealing of copper does not occur repeatedly to cause the volume of copper to change in the subsequent fabrication process, which can prevent copper from volume expansion and extending horizontally to penetrate the cavity C and diffuse into the substrate 110 to cause a tip crack, and can also prevent copper from extending vertically to penetrate and diffuse into the lines on the substrate 110 to cause a pumping issue, and thus enhances the electrical properties and the reliability of the applied devices.

The method of the embodiment as depicted in FIG. 1A-FIG. 1F could be applied to different processes, such as the via-first approach, the via-middle approach, and the via-last approach. The cavity C of the embodiment can be used to form a through silicon via.

Figure 2:
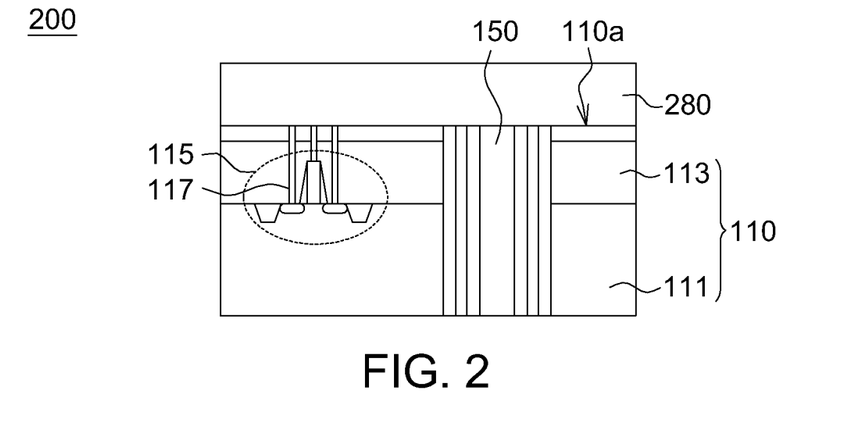
FIG. 2 shows a semiconductor structure according to the embodiment of the disclosure applied in a via-middle approach, wherein the cavity is formed after the formation of the active devices.

In the via-middle approach, the through silicon via is fabricated after the formation of the active devices and before the fabrication of the back end of the line (BEOL). In the via-middle approach, the method of the embodiment could be applied after the formation of the active devices 115 and before the fabrication of BEOL by forming the cavity C on the substrate 110 and forming the conductor layer 150 in the cavity C. Meanwhile, as shown in FIG. 1F, the provided substrate 110 may comprise a plurality of active devices 115 and contacts 117 before forming the cavity C. Please refer to FIG. 1A-FIG. 1F and FIG. 2. FIG. 2 shows a semiconductor structure according to the embodiment of the disclosure applied in a via-middle approach, wherein the cavity is formed after the formation of the active devices.

As shown in FIG. 1A, a plurality of active devices 115 are formed on the silicon layer 111, firstly. Then, an inter-layer dielectric 113 is formed on the active devices 115, and a plurality of contacts 117 are formed in the inter-layer dielectric 113. Next, the cavity C filled with the conductor layer 150 is formed on the substrate 110 by the steps as the processes depicted in FIG. 1B-FIG. 1F.

Afterward, fabrication of back end of the Line (BEOL) 280 on the surface 110a of the substrate 110 is completed in the subsequent procedures, as shown in FIG. 2. In the embodiment, the surface 110a of the substrate 110 is the front side of a wafer. In the embodiment, for example, the BEOL 280 is fabricated on the conductor layer 150. Also, it is also important to point out that the drawing of the BEOL 280 in FIG. 2 is to be regard as an illustrative sense rather than a restrictive sense. The fabrication of BEOL 280 may further comprise forming a plurality of dielectric layers and a plurality of metal interconnect line structures. Moreover, the fabrication of BEOL 280 may further comprise forming protective layers and bonding pads on the dielectric layers and the metal interconnect line structures.

And then, a surface of the substrate 110 opposite to the surface 110a is thinned to expose part of the conductor layer 150. As such, the semiconductor structure 200 as shown in FIG. 2 is formed. Other components in FIG. 2 are already disclosed above as depicted in FIG. 1A-FIG. 1F, and are not redundantly described here. In the embodiment, conductor layer 150 in the cavity C can form a TSV (through silicon via) in a three-dimensional integrated circuit (3D-IC).

Figure 3A:
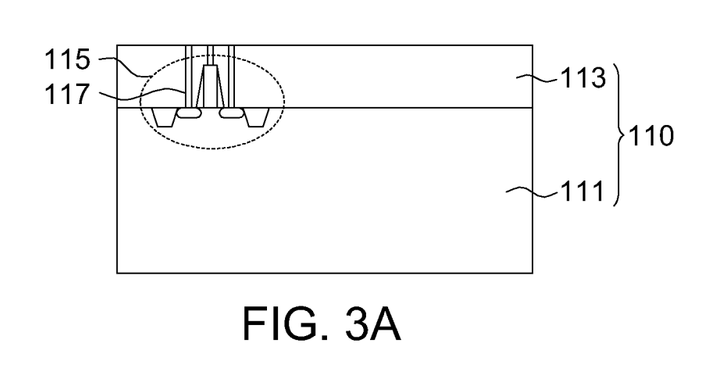
FIG. 3A-FIG. 3C illustrate a method of manufacturing a semiconductor structure according to the embodiment of the disclosure applied in a via-last approach, wherein the cavity is formed after the formation of the BEOL.
Figure 3B:
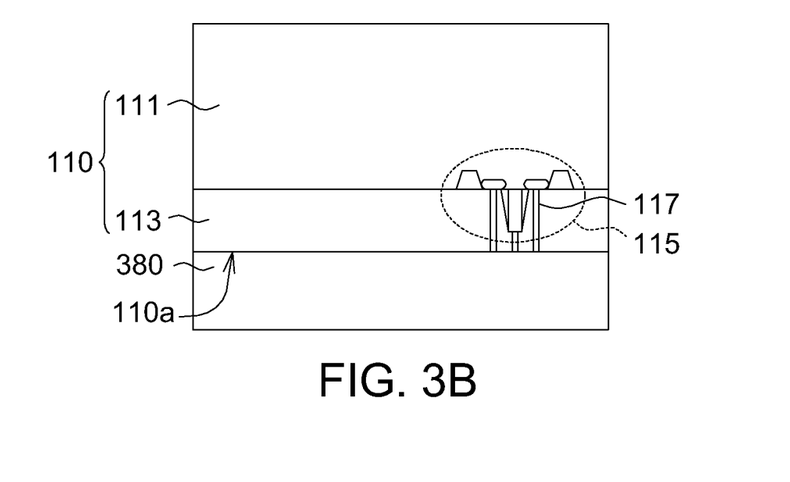
Figure 3C:
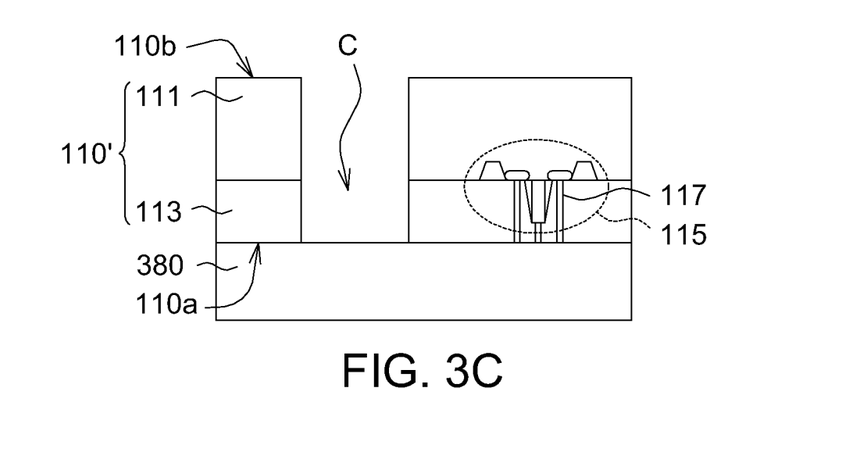

Additionally, besides the via-middle approach, the method of the embodiment as depicted in FIG. 1A-FIG. 1F could be applied to the via-last approach. In the via-last approach, the steps of forming the through silicon via and filling conductors in the through silicon via could be performed after fabrication of back end of the line (BEOL), and before or after stacking the wafers. Please refer to FIG. 1A-FIG. 1G and FIG. 3A-FIG. 3C. FIG. 3A-FIG. 3C illustrate a method of manufacturing a semiconductor structure according to the embodiment of the disclosure applied in a via-last approach, wherein the cavity is formed after the formation of the BEOL. Also, it is also important to point out that the drawings of the BEOL 380 in FIG. 3B-FIG. 3C are to be regard as an illustrative sense rather than a restrictive sense.

In the via-last approach, as shown in FIG. 3A, a plurality of active devices 115 are formed on the silicon layer 111, firstly. Then, an inter-layer dielectric 113 is formed on the active devices 115. Next, a plurality of contact holes 117 are formed in the inter-layer dielectric 113, and conductive materials can be filled in the contact holes 117 to form a plurality of contact plugs.

Next, as shown in FIG. 3B, the fabrication of back end of the line (BEOL) 380 on the surface 110a of the substrate 110 is completed. In the embodiment, the surface 110a of the substrate 110 is the front side of a wafer. In the embodiment, for example, the BEOL 380 is fabricated on the inter-layer dielectric 113. After the fabrication of the BEOL 380 is completed, the structure as a whole may be flipped upside down, as shown in FIG. 3B, such that silicon layer 111 is at the top of the substrate 110, and the BEOL 380 is below the substrate 110.

And then, as shown in FIG. 3C, a surface of the substrate 110 opposite to the surface 110a is thinned to form a thinned substrate 110'. Next, the cavity C is formed on the side of the substrate 110' opposite to the BEOL 380 by the steps depicted in FIG. 1B-FIG. 1F. The cavity C extends down from the surface 110b of the substrate 110'. In the embodiment, the side of the substrate 110' (such as the surface 110b of the substrate 110') opposite to the BEOL 380 is the back side of a wafer. In the embodiment, the cavity C extends down from the silicon layer 111 to the inter-layer dielectric 113. In one embodiment, as shown in FIG. 3C, the cavity C extends down to about the interface between the inter-layer dielectric 113 and the BEOL 380, such that the conductor layer 150 which will be formed in the cavity C in the following steps can be electrically connected to the metal layers formed in the BEOL 380. In another embodiment, the cavity C extends down to about the interface between the inter-layer dielectric 113 and the silicon layer 111, such that the conductor layer 150 which will be formed in the cavity C in the following steps can be electrically connected to the contact plugs in the inter-layer dielectric 113. Other components are already disclosed above as depicted in FIG. 1A-FIG. 1F, and are not redundantly described here.

A 3D package contains two or more wafers (chips) having at through silicon vias can be fabricated from the cavity C according to the method of the embodiment. After the wafers are vertically stacked, the connection of the through silicon vias filled with conductor layers creates a conducting path to replace edge wiring, thereby reducing the length of conductive line to the thickness of wafers (chips). The vertical connections through the body of the wafers (chips) in 3D packages not only enhance the speed of signal transfer and electrical transmission, but also perform the heterogeneous integration of different ICs; for example, stacking memory on the processor. Therefore, by preventing the conductor layer from volume expansion and extending to penetrate the cavity and diffuse into the substrate and the lines on the substrate, the electrical properties and the reliability of the applied devices can be enhanced.

According to the aforementioned methods of the embodiments, utilizing a two-step process, including filling a first conductor in part of a cavity and performing a first thermal treatment on the first conductor, and filling a second conductor in the cavity and performing a second thermal treatment on the second conductor can prevent the conductor layer from volume expansion and penetrating the cavity to diffuse into the substrate and the lines on the substrate, and hence the electrical properties and the reliability of the applied devices can be enhanced. The method of the embodiment could be applied to different processes, including the via-middle approach and the via-last approach. Moreover, the flexibility of the embodiment in application is large. In practical applications, the steps of the methods could be adjusted or modified according to actual needs. For example, the heating temperature and the heating time duration in the thermal treatments can be adjusted and optimized in accordance with different fabrications of BEOL.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor structure, comprising:
   providing a substrate, wherein the substrate includes a silicon layer and an inter-layer dielectric (ILD) formed on the silicon layer, the inter-layer dielectric having a plurality of contact holes;
   etching the substrate to form a cavity;
   filling a first conductor in part of the cavity;
   performing a first thermal treatment on the first conductor;
   filling a second conductor in the cavity to fill-up the cavity; and
   performing a second thermal treatment on the first conductor and the second conductor.

2. The method of manufacturing the semiconductor structure according to claim 1, wherein a material of the first conductor is the same as that of the second conductor.

3. The method of manufacturing the semiconductor structure according to claim 1, wherein the material of the first conductor comprises copper, and the material of the second conductor comprises copper.

4. The method of manufacturing the semiconductor structure according to claim 1, wherein the volume of the first conductor is 20-80% of the volume of the cavity.

5. The method of manufacturing the semiconductor structure according to claim 1, wherein in the step of performing the first thermal treatment, the first conductor is heated at 350-450° C.

6. The method of manufacturing the semiconductor structure according to claim 5, wherein in the step of performing the first thermal treatment, the first conductor is heated for 5 to 60 minutes.

7. The method of manufacturing the semiconductor structure according to claim 1, wherein in the step of performing the second thermal treatment, the first conductor and the second conductor are heated at 350-450° C.

8. The method of manufacturing the semiconductor structure according to claim 7, wherein in the step of performing the second thermal treatment, the first conductor and the second conductor are heated for 5 to 60 minutes.

9. The method of manufacturing the semiconductor structure according to claim 1, wherein prior to the step of etching the substrate to form the cavity, the method further comprises:
   forming a nitride layer on the substrate.

10. The method of manufacturing the semiconductor structure according to claim 1, wherein after the step of etching the substrate to form the cavity, the method further comprises:
    forming a liner film layer in the cavity.

11. The method of manufacturing the semiconductor structure according to claim 1, wherein after the step of etching the substrate to form the cavity, the method further comprises:
    forming a barrier layer in the cavity.

12. The method of manufacturing the semiconductor structure according to claim 11, wherein after the step of etching the substrate to form the cavity, the method further comprises:
    forming a seed layer on the barrier layer.

13. The method of manufacturing the semiconductor structure according to claim 1, wherein the step of providing the substrate further comprises:
    forming a plurality of active devices on the silicon layer.

14. The method of manufacturing the semiconductor structure according to claim 1, wherein after the step of performing the second thermal treatment, the method further comprises:
    performing a chemical mechanical polishing (CMP) on the first conductor and the second conductor to remove part of the first conductor and the second conductor extruded from the cavity, wherein the first conductor and the second conductor filled in the cavity forms a conductive layer after being chemical mechanical polished.

15. The method of manufacturing the semiconductor structure according to claim 14, wherein after the step of performing the chemical mechanical polishing, the method further comprises:
    fabricating a back-end-of-the-line (BEOL) on the conductive layer.

16. The method of manufacturing the semiconductor structure according to claim 1, further comprising:
    fabricating a back end of the line (BEOL) on the substrate prior to the step of etching the substrate to form the cavity; and
    etching a side of the substrate opposite to the back end of the line (BEOL) to form the cavity.

17. The method of manufacturing the semiconductor structure according to claim 16, wherein the substrate further comprises an inter-layer dielectric (ILD) formed on the silicon layer, the back end of the line (BEOL) is disposed on a side of the inter-layer dielectric (ILD) opposite to the silicon layer, and the cavity extends down from the silicon layer to the inter-layer dielectric (ILD).

* * * * *